(12) United States Patent
Wu et al.

(10) Patent No.: US 12,543,464 B2
(45) Date of Patent: Feb. 3, 2026

(54) PIXEL STRUCTURE, DISPLAY SUBSTRATE AND DISPLAY DEVICE

(71) Applicants: Chengdu BOE Optoelectronics Technology Co., Ltd., Sichuan (CN); BOE Technology Group Co., Ltd., Beijing (CN)

(72) Inventors: Jianpeng Wu, Beijing (CN); Jianbo Li, Beijing (CN); Wenbiao Ding, Beijing (CN); Qingxian Li, Beijing (CN); Juan Li, Beijing (CN); Huan Wu, Beijing (CN); Ju Mei, Beijing (CN)

(73) Assignees: Chengdu BOE Optoelectronics Technology Co., Ltd., Sichuan (CN); Beijing BOE Technology Development Co., Ltd., Beijing (CN)

( * ) Notice: Subject to any disclaimer, the term of this patent is extended or adjusted under 35 U.S.C. 154(b) by 325 days.

(21) Appl. No.: 18/016,808

(22) PCT Filed: Feb. 18, 2022

(86) PCT No.: PCT/CN2022/076847
§ 371 (c)(1),
(2) Date: Jan. 18, 2023

(87) PCT Pub. No.: WO2023/155134
PCT Pub. Date: Aug. 24, 2023

(65) Prior Publication Data
US 2024/0251624 A1    Jul. 25, 2024

(51) Int. Cl.
*H10K 59/35* (2023.01)
*H10K 59/131* (2023.01)

(52) U.S. Cl.
CPC ......... *H10K 59/352* (2023.02); *H10K 59/131* (2023.02); *H10K 59/351* (2023.02); *H10K 59/353* (2023.02)

(58) Field of Classification Search
CPC .................. G09G 2300/0443; H10K 59/00–88
See application file for complete search history.

(56) References Cited

U.S. PATENT DOCUMENTS

2006/0274090 A1\* 12/2006 Koyama .............. G09G 3/3258
345/695
2012/0147065 A1    6/2012 Byun et al.
(Continued)

FOREIGN PATENT DOCUMENTS

| CN | 102568376 A | 7/2012 |
|----|-------------|--------|
| CN | 104778919 A | 7/2015 |

(Continued)

OTHER PUBLICATIONS

Office Action dated Dec. 4, 2025, issued in corresponding Chinese patent application No. 202280000210.3 with English translation (22 pages).

*Primary Examiner* — Evren Seven
(74) *Attorney, Agent, or Firm* — WHDA, LLP (57) ABSTRACT

The present disclosure provides a pixel structure, a display substrate and a display device, and relates to the field of display technology. The pixel structure includes a plurality of sub-pixels located in an imaginary quadrilateral, the plurality of sub-pixels include a first color sub-pixel, a second color sub-pixel and at least one third color sub-pixel, the imaginary quadrilateral includes a first inner corner and a second inner corner that are opposite to each other, and a third inner corner and a fourth inner corner that are opposite to each other. The first color sub-pixel is located at the first inner corner c1, the second color sub-pixel 22 is located at (Continued)

the second inner corner c2, and at least one third color sub-pixel is located at the third inner corner c3 and the fourth inner corner c4.

20 Claims, 8 Drawing Sheets

(56) References Cited

U.S. PATENT DOCUMENTS

| | | | | |
|---|---|---|---|---|
| 2015/0379924 | A1* | 12/2015 | Matsueda | G09G 3/3208 |
| | | | | 345/77 |
| 2017/0169748 | A1 | 6/2017 | Chen | |
| 2017/0294155 | A1* | 10/2017 | Kim | G09G 3/2074 |
| 2020/0279517 | A1 | 9/2020 | Huang | |
| 2023/0413639 | A1* | 12/2023 | Kim | H10K 59/65 |

FOREIGN PATENT DOCUMENTS

| | | |
|---|---|---|
| CN | 106887208 A | 6/2017 |
| CN | 109859685 A | 6/2019 |
| CN | 111799320 A | 10/2020 |

\* cited by examiner

PIXEL STRUCTURE, DISPLAY SUBSTRATE AND DISPLAY DEVICE

CROSS-REFERENCE TO RELATED APPLICATION

This application is a national phase application under 35 U.S.C. § 371 of International Patent Application No. PCT/CN2022/076847 filed on Feb. 18, 2022, entitled "PIXEL STRUCTURE, DISPLAY SUBSTRATE AND DISPLAY DEVICE", the disclosure of which is incorporated by reference in its entirety herein.

TECHNICAL FIELD

The present disclosure relates to the field of display technology, in particular to a pixel structure, a display substrate and a display device.

BACKGROUND

Compared with conventional liquid crystal display devices, OLED (Organic Light emitting Diode) display devices are one of the popular research fields of current display devices due to advantages of low energy consumption, low production cost, self-illumination, wide viewing angle and fast response speed, and are widely used in the field of mobile phones and tablet computers.

SUMMARY

The present disclosure provides a pixel structure, including a plurality of sub-pixels located in an imaginary quadrilateral, the plurality of sub-pixels include a first color sub-pixel, a second color sub-pixel and at least one third color sub-pixel, the imaginary quadrilateral includes a first inner corner and a second inner corner that are opposite to each other, and a third inner corner and a fourth inner corner that are opposite to each other; the first color sub-pixel is located at the first inner corner, the second color sub-pixel is located at the second inner corner, and the at least one third color sub-pixel is located at the third inner corner and the fourth inner corner respectively.

In an implementation, the pixel structure includes two third color sub-pixels, and the two third color sub-pixels are located at the third inner corner and the fourth inner corner respectively.

In an implementation, light emitting layers of the two third color sub-pixels are disconnected at boundaries of the two third color sub-pixels.

In an implementation, the third color sub-pixel located at the third inner corner has a first side, the third color sub-pixel located at the fourth inner corner has a second side, and the first side and the second side are adjacent and parallel to each other.

In an implementation, a shape of the first color sub-pixel is a quadrilateral; and/or,
a shape of the second color sub-pixel is a quadrilateral; and/or,
a shape of the third color sub-pixel is an octagon.

In an implementation, the quadrilateral is a square, a side of the first color sub-pixel has a first side length, and a side of the second color sub-pixel has a second side length, and the second side length is greater than or equal to the first side length.

In an implementation, the octagon is a regular octagon.

In an implementation, a distance between any two opposite sides of the regular octagon is equal to the second side length.

In an implementation, the second side length is greater than the first side length; the octagon has a third side and a fourth side that are opposite to each other, and a fifth side and a sixth side that are opposite to each other, the third side is arranged close to the first color sub-pixel, and the fifth side is arranged close to the second color sub-pixel;
a distance between the third side and the fourth side is greater than a distance between the fifth side and the sixth side.

In an implementation, the distance between the third side and the fourth side is greater than the second side length, and the distance between the fifth side and the sixth side is equal to the second side length.

In an implementation, light emitting layers of the two third color sub-pixels are continuous at boundaries of the two third color sub-pixels.

In an implementation, a shape of the first color sub-pixel is a triangle; and/or
a shape of the second color sub-pixel a triangle.

In an implementation, at least one inner corner of the triangle is chamfered.

In an implementation, the triangle is an isosceles right-angled triangle, and a length of a right-angled side of the second color sub-pixel is greater than or equal to a length of a right-angled side of the first color sub-pixel.

In an implementation, a ratio between an area of the first color sub-pixel, an area of the second color sub-pixel and a total area of two third color sub-pixel is one of 1:1:1.5 and 1:1.2:2.4.

In an implementation, driving electrodes of the two third color sub-pixels are connected to one driving circuit, and the driving circuit is configured to apply a driving signal to the driving electrodes, so that the third color sub-pixels are driven to emit light.

In an implementation, the first color sub-pixel is a red sub-pixel, the second color sub-pixel is a green sub-pixel, and the third color sub-pixel is a blue sub-pixel.

In an implementation, the imaginary quadrilateral is a square.

The present disclosure provides a display substrate including any one of the pixel structures.

In an implementation, the display substrate includes a plurality of pixel structures arranged in an array.

The present disclosure provides a display device including any one of the display substrates.

The above description is only a summary of solutions of the present disclosure. In order to make technical means of the present disclosure be better understood and implemented according to the disclosure of the description, and in order to make the above and other objects, features and advantages of the present disclosure more obvious and understandable, specific embodiments of the present disclosure are illustrated below.

BRIEF DESCRIPTION OF THE DRAWINGS

In order to more clearly illustrate technical solutions of embodiments of the present disclosure or the related art, drawings that need to be used in the description of the embodiments or the related art are briefly introduced below. Apparently, the drawings described below merely illustrate some embodiments of the present disclosure, those skilled in the art can also obtain other drawings based on these drawings, without paying any creative labor. It should be noted that the scales in the drawings are only for illustration and do not represent actual scales.

DETAILED DESCRIPTION OF THE EMBODIMENTS

In order to make the objects, technical solutions and advantages of the embodiments of the present disclosure clearer, the technical solutions of the embodiments of the present disclosure will be clearly and completely described below with reference to the drawings in the embodiments of the present disclosure. Apparently, the described embodiments are some of the embodiments of the present disclosure, rather than all of them. Based on the embodiments in the present disclosure, all other embodiments obtained by those skilled in the art without paying creative labor fall within the protection scope of the present disclosure.

Figure 1:
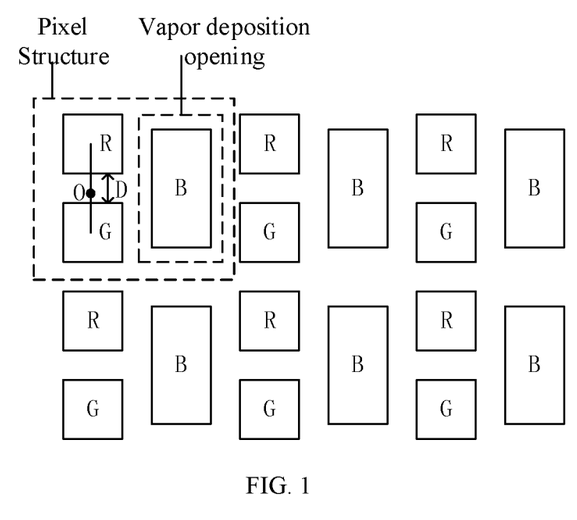
FIG. 1 is a schematic diagram illustrating a pixel structure of the related art.

As shown in FIG. 1, a display substrate in the related art generally includes a plurality of pixel structures arranged in an array, and the pixel structure is the smallest repetitive unit in the display substrate. The pixel structure includes a red sub-pixel 'R', a green sub-pixel 'G' and a blue sub-pixel 'B'. The red sub-pixel 'R' and the green sub-pixel 'G' are arranged in the same column, while the blue sub-pixel 'B' is arranged in an adjacent column. As shown in FIG. 1, a brightness center 'O' of the pixel structure is located at the midpoint of a line connecting centers of the red sub-pixel 'R' and the green sub-pixel 'G', and is slightly close to the green sub-pixel 'G'.

In the display substrate, since the brightness center 'O' of each pixel structure is located on the left side of the pixel structure, graphic asymmetry in a left-to-right viewing angle easily occurs on a display screen.

In view of the above problems, the present disclosure provides a pixel structure, including a plurality of sub-pixels located in an imaginary quadrilateral 'S'. As shown in graph 'a' in FIG. 2 to FIG. 6, each of the sub-pixels includes a first color sub-pixel 21, a second color sub-pixel 22 and at least one third color sub-pixel 23, and the imaginary quadrilateral 'S' includes a first inner corner c1 and a second inner corner c2 that are opposite to each other, and a third inner corner c3 and a fourth inner corner c4 that are opposite to each other.

The first color sub-pixel 21 is located at the first inner corner c1, the second color sub-pixel 22 is located at the second inner corner c2, and at least one third color sub-pixel 23 is located at the third inner corner c3 and the fourth inner corner c4.

The pixel structure may include one or more third color sub-pixels 23, which is not limited in the present disclosure. The pixel structure shown in graph 'a' in FIG. 2 to FIG. 6 includes two third color sub-pixels 23.

The first color sub-pixel 21, the second color sub-pixel 22 and the third color sub-pixel 23 are configured to emit light of different colors respectively. The first color sub-pixel 21 may be a red sub-pixel R, a green sub-pixel G, or a blue sub-pixel B, and so on. The second color sub-pixel 22 may be a red sub-pixel R, a green sub-pixel G, or a blue sub-pixel B, and so on. The third color sub-pixel 23 may be a red sub-pixel R, a green sub-pixel G, or a blue sub-pixel B, and so on.

As shown in graph 'a' of FIG. 2 to FIG. 6, the center O1 of the first color sub-pixel 21 and the center O2 of the second color sub-pixel 22 may be located on a diagonal line of the imaginary quadrilateral S, and the center of at least one third color sub-pixel 23 may be located on the other diagonal of the imaginary quadrilateral S or arranged along the extension direction of the other diagonal of the imaginary quadrilateral S.

When the first color sub-pixel 21 is a red sub-pixel R and the second color sub-pixel 22 is a green sub-pixel G, the brightness center O' of the pixel structure is located at the middle point of a connecting line between the center O1 of the red sub-pixel R and the center O2 of the green sub-pixel G, and is slightly close to the green sub-pixel G, and as shown in FIGS. 2 to 6, the center O1 of the first color sub-pixel 21 and the center O2 of the second color sub-pixel 22 are located on a diagonal of the quadrilateral S. Therefore, the brightness center O' of the pixel structure provided by the present disclosure is located on a diagonal of the imaginary quadrilateral S, and is close to the geometric center of the pixel structure, as shown in graph 'a' in FIGS. 2 to 6. By using the pixel structure provided by the present disclosure, the brightness uniformity of the display screen can be improved, the problem of graphic asymmetry of the display screen in the left-to-right viewing angle can be solved, and the display quality is improved.

The first color sub-pixel 21, the second color sub-pixel 22 and the third color sub-pixel 23 are all sub-pixels in the pixel structure. The light emitting layer in each sub-pixel is generally formed by evaporating an organic light emitting material through a mask plate. The sub-pixels of different colors are provided with organic light emitting materials of different light emitting colors.

In the pixel structure shown in FIG. 1, the distance between the red sub-pixel R and the green sub-pixel G is the width D of the pixel defining layer. In practical application, it is found that the light emitting layer of the red sub-pixel R and the light emitting layer of the green sub-pixel G tend to overlap. Especially, in the structure shown in FIG. 7, the light emitting layer 71 of the red sub-pixel R and the light emitting layer 72 of the green sub-pixel G each include a plurality of stacked film layers. Since the light emitting layer includes a large number film layers, the probability of film layer shifting increases during the vapor deposition process, and serious overlapping more likely occurs between the light emitting layer 71 of the red sub-pixel R and the light emitting layer 72 of the green sub-pixel G.

In the embodiments of the present disclosure, when the first color sub-pixel 21 is a red sub-pixel R and the second color sub-pixel 22 is a green sub-pixel G, as shown in FIGS. 2 to 6, the first color sub-pixel 21 and the second color sub-pixel 22 are located on the diagonal of the imaginary quadrilateral S, thus the distance d1 between the first color sub-pixel 21 and the second color sub-pixel 22 is at least $\sqrt{2}$ times the width D of the pixel defining layer.

Compared with the structure shown in FIG. 1, in the pixel structure provided by the present disclosure, the distance between the first color sub-pixel 21 and the second color sub-pixel 22 is increased, which allows to effectively reduce the probability that the light emitting layer of the first color sub-pixel 21 and the light emitting layer of the second color sub-pixel 22 overlap with each other, reduce the probability of lateral mobility of carriers between the first color sub-pixel 21 and the second color sub-pixel 22, thereby reducing poor signal crosstalk such as red-tint under low gray level.

Figure 7:
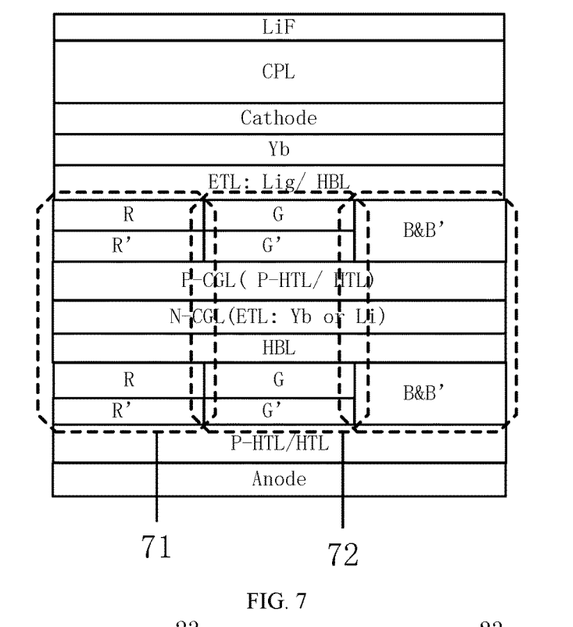
FIG. 7 is a schematic cross-sectional diagram of a pixel structure provided by the present disclosure.

When at least one of the light emitting layer 71 of the first color sub-pixel 21 and the light emitting layer 72 of the second color sub-pixel 22 includes a plurality of stacked film layers, as shown in FIG. 7, poor signal crosstalk can be significantly improved by using the pixel structure provided by the present disclosure.

In some embodiments, the imaginary quadrilateral S may be a square, a rectangle, a parallelogram, a rhombus, a trapezoid and the like, which is not limited in the present disclosure. When the imaginary quadrilateral S is a square (as shown in graph 'a' in FIGS. 2 to 6), it can effectively avoid distortion of the image displayed on the display screen, and avoid problems such as incongruous scales of the displayed image.

As shown in graph 'a' of FIG. 2 to FIG. 6, the pixel structure may include two third color sub-pixels 23 that are located at the third inner corner c3 and the fourth inner corner c4 respectively.

When the first color sub-pixel 21 is a red sub-pixel R and the second color sub-pixel 22 is a green sub-pixel G, the two third color sub-pixels 23 may be a blue sub-pixel B1 and a blue sub-pixel B2 respectively.

The blue sub-pixel B in FIG. 1 is rectangular and has a large aspect ratio. Therefore, in the manufacturing process of the mask plate, it is hard to guarantee the opening size and manufacturing accuracy of the blue sub-pixel B.

Figure 2:
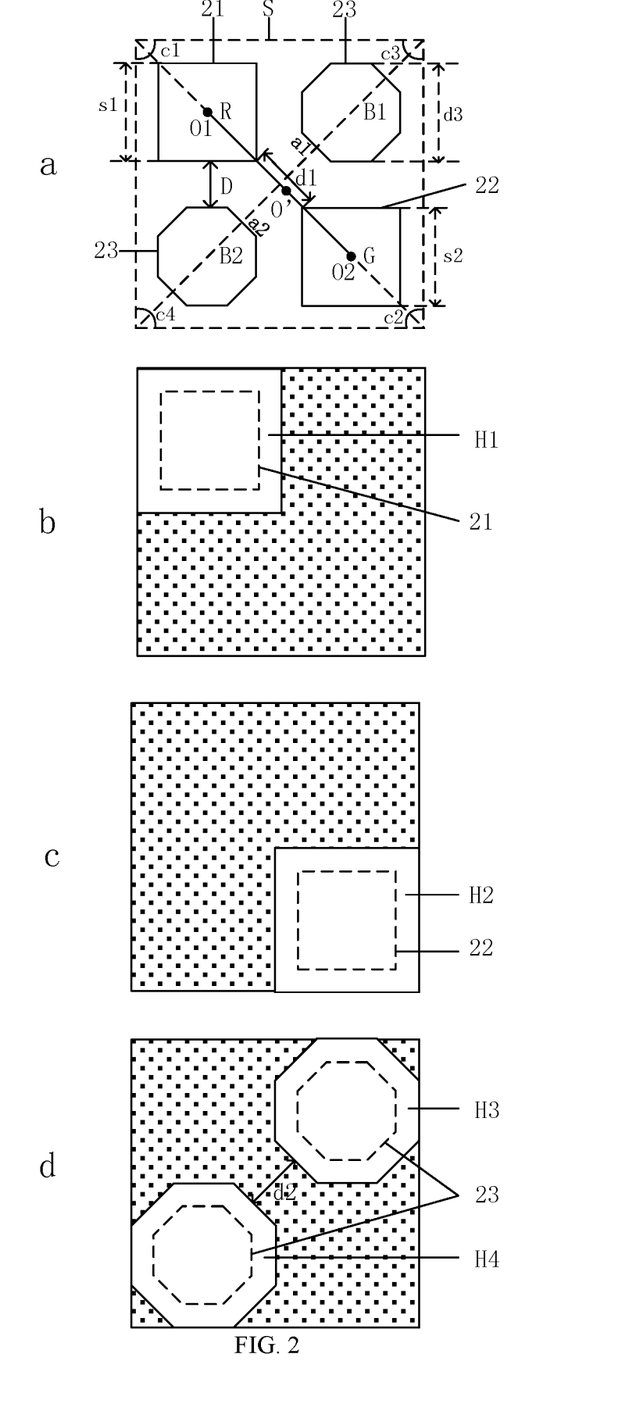
FIG. 2 is a schematic diagram illustrating a first pixel structure and a mask plate provided by the present disclosure.
Figure 3:
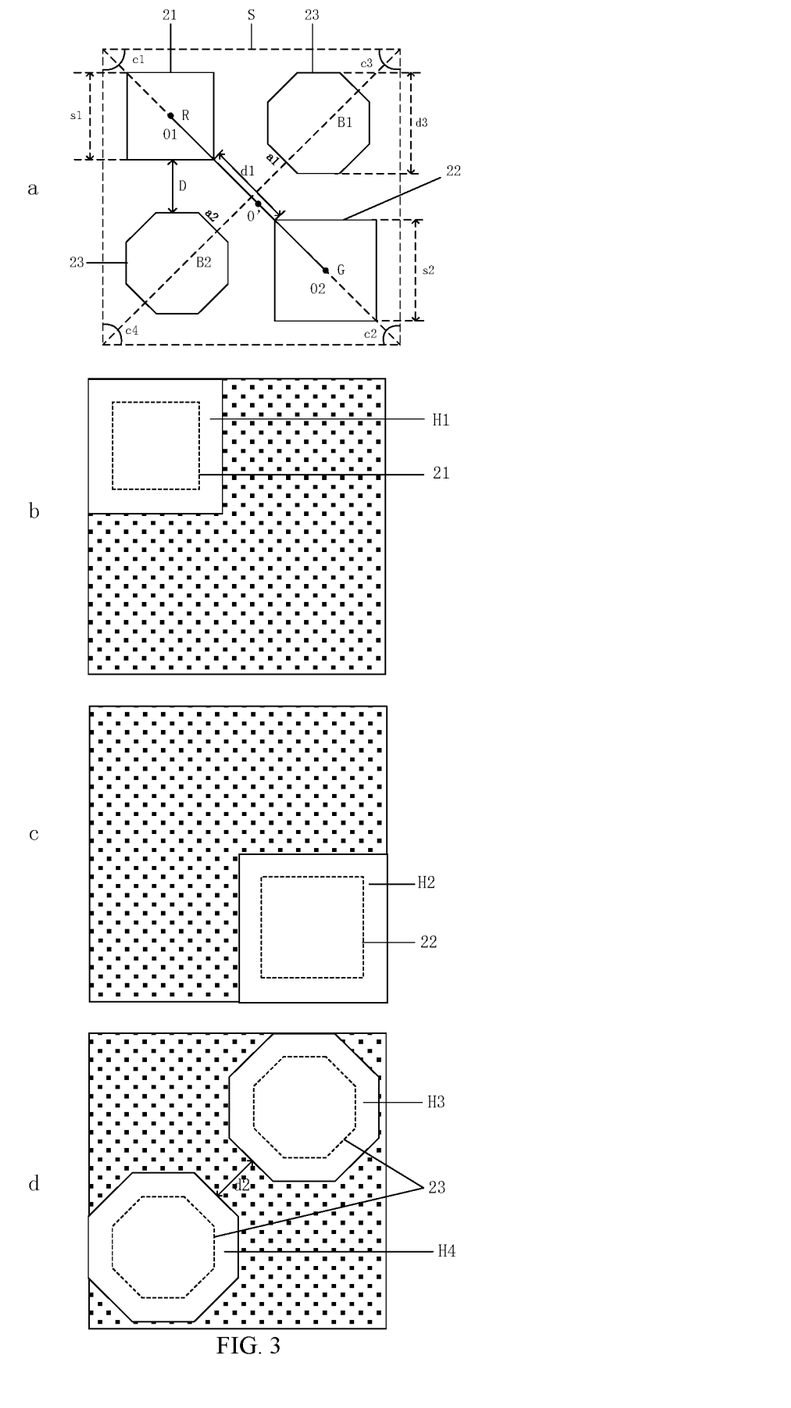
FIG. 3 is a schematic diagram illustrating a second pixel structure and a mask plate provided by the present disclosure.
Figure 4:
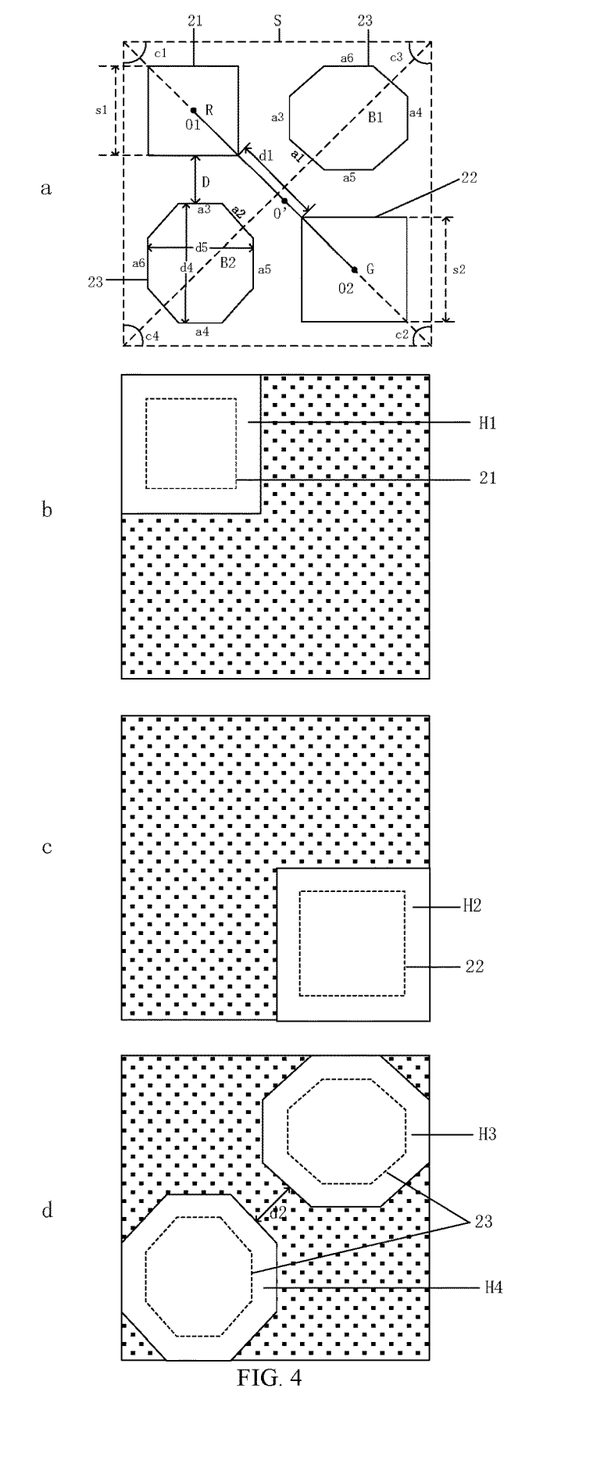
FIG. 4 is a schematic diagram illustrating a third pixel structure and a mask plate provided by the present disclosure.

To solve this problem, in an implementation manner, the two third color sub-pixels 23 shown in graph 'a' in FIG. 2 to FIG. 4 may correspond to different vapor deposition openings in the same mask respectively. That is, the light emitting layers in the two third color sub-pixels 23 can be formed by vapor deposition using different vapor deposition openings in the same mask plate.

As shown in FIG. 2 to FIG. 4, graph 'b' shows a high-precision metal mask plate with an vapor deposition opening H1, and the vapor deposition opening H1 corresponds to the first color sub-pixel 21 (indicated by the dotted line box in graph 'b').

As shown in FIG. 2 to FIG. 4, graph 'c' shows a high-precision metal mask plate with an vapor deposition opening H2, and the vapor deposition opening H2 corresponds to the second color sub-pixel 22 (indicated by the dotted line box in graph 'c').

As shown in FIG. 2 to FIG. 4, graph 'd' shows a high-precision metal mask plate with an vapor deposition opening H3 and an vapor deposition opening H4, and the vapor deposition opening H3 and the vapor deposition opening H4 correspond to one third color sub-pixel 23 (indicated by the dotted box in graph 'd'), respectively.

In this implementation manner, each of the two third color sub-pixels 23 corresponds to one vapor deposition opening, so that the light emitting layers of the two third color sub-pixels 23 are disconnected at the boundaries of the two third color sub-pixels 23.

By providing two third color sub-pixels 23 that correspond to one vapor deposition opening respectively, the aspect ratio of the vapor deposition opening is reduced to be close to 1:1, and the production difficulty of the mask plate is reduced.

As shown in graph 'a' in FIG. 2 to FIG. 4, the third color sub-pixel 23 located at the third inner corner c3 has a first side a1, and the third color sub-pixel 23 located at the fourth inner corner c4 has a second side a2.

In some embodiments, the first side a1 and the second side a2 are adjacent to and parallel to each other.

In practical applications, when the distance between two adjacent vapor deposition openings in the mask plate (that is, the width of the solid material, 'd2' as shown in graph 'd' in FIG. 2 to FIG. 4) is less than a process limit value such as 15 microns, it would be easy to etch through a space between the two adjacent vapor deposition openings during a wet etching process of the mask plate, resulting in deformation of the vapor deposition openings. Therefore, in order to prevent deformation of the vapor deposition openings, the minimum distance between two adjacent vapor deposition openings in the same mask plate needs to be greater than or equal to the process limit value.

In this implementation manner, the first side a1 and the second side a2 in two sub-pixels of the third-color are adjacent to and parallel to each other, so that the manufacturing process requirements for the mask plate can be met (that is, the distance between two adjacent vapor deposition openings is greater than or equal to the process limit value) and the aperture ratio of the third color sub-pixel 23 is increased as much as possible.

In a specific embodiment, the shape of the first color sub-pixel 21 may be a quadrilateral. Specifically, the quadrilateral may have the same shape as the imaginary quadrilateral S. For example, when the imaginary quadrilateral S is a square, the shape of the first color sub-pixel 21 may also be a square (as shown in graph 'a' in FIG. 2 to FIG. 4); when the imaginary quadrilateral S is a rectangle, the shape of the first color sub-pixel 21 may also be a rectangle; when the imaginary quadrilateral S is a parallelogram, the shape of the first color sub-pixel 21 may also be a parallelogram, and so on.

In a specific embodiment, the shape of the second color sub-pixel 22 may be a quadrilateral. Specifically, the quadrilateral may have the same shape as the imaginary quadrilateral S. For example, when the imaginary quadrilateral S is a square, the shape of the second color sub-pixel 22 may also be a square (as shown in graph 'a' in FIG. 2 to FIG. 4); when the imaginary quadrilateral S is a rectangle, the shape of the second color sub-pixel 22 may also be a rectangle; when the imaginary quadrilateral S is a parallelogram, the shape of the second color sub-pixel 22 may also be a parallelogram, and so on.

In some embodiments, as shown in graph 'a' in FIG. 2 to FIG. 4, the imaginary quadrilateral S, the shape of the first color sub-pixel 21 and the shape of the second color sub-pixel 22 are all square. The first color sub-pixel 21 has a first side length s1, and the second color sub-pixel 22 has a second side length s2.

The second side length s2 may be equal to the first side length s1 (as shown in graph 'a' in FIG. 2). The second side length s2 may also be greater than the first side length s1 (as shown in graph 'a' in FIG. 3 and FIG. 4).

When the first color sub-pixel 21 is a red sub-pixel R, and the second color sub-pixel 22 is a green sub-pixel G, by setting the second side length s2 to be greater than the first side length s1, the area of the second color sub-pixel 22 is larger than the area of the first color sub-pixel 21, so that the light emitting life of the green sub-pixel G is increased and the service life of the display device is increased.

In a specific embodiment, the shape of the third color sub-pixel 23 may be a quadrilateral. However, in the pixel structure, when the vertex angles of two quadrangular third color sub-pixels 23 face each other, the requirement that the first side a1 and the second side a2 are adjacent and parallel to each other is not met. In this case, if the aperture ratio of the sub-pixels 23 is constant, the vapor deposition openings corresponding to the two third color sub-pixels 23 may be etched through in the wet etching process of the mask plate. On the other hand, when the sides of the two quadrangular third color sub-pixels 23 face each other, the aperture ratio of the third color sub-pixel 23 may decrease while the manufacturing process of the mask plate is satisfied.

In order to solve this problem, as shown in graph 'a' in FIG. 2 to FIG. 4, the third color sub-pixel 23 may have a shape of an octagon.

By providing octagonal third color sub-pixels 23, the first side a1 and the second side a2 can be adjacent and parallel to each other, so that the aperture ratio of the third color sub-pixels 23 can be increased as much as possible while meeting the process requirements for manufacturing the mask plate.

When the pixel structures provided by the present disclosure are arranged in an array, the octagonal third color sub-pixels 23 can ensure that any adjacent two third color sub-pixels 23 have adjacent and parallel sides, thereby meeting the process requirements for manufacturing the mask plate and increasing the aperture ratio of the third color sub-pixels 23 as much as possible.

In addition, by providing octagonal third color sub-pixels 23, the aspect ratio of the vapor deposition opening corresponding to the third color sub-pixels 23 may approach to 1:1, thereby further reducing the manufacturing difficulty of the mask plate.

As shown in graph 'a' in FIG. 2 to FIG. 3, the octagon may be a regular octagon.

In addition, by providing third color sub-pixels 23 having a shape of regular octagon, the aspect ratio of the vapor deposition opening corresponding to the third color sub-pixels 23 may reach 1:1, thereby further reducing the manufacturing difficulty of the mask plate.

In a specific implementation, the distance d3 between any two opposite sides of the regular octagon may be equal to the second side length s2.

In FIG. 2, the relationship between the first side length s1, the second side length s2 and the distance d3 between any two opposite sides in the regular octagon is: s1=s2=d3.

In FIG. 2, the relationship between the first side length s1, the second side length s2 and the distance d3 between any two opposite sides in the regular octagon is: s1<s2=d3.

In a specific implementation, the octagon may also be a non-regular octagon.

As shown in graph 'a' in FIG. 4, the second side length s2 is greater than the first side length s1, and the octagon can have a third side a3 and a fourth side a4 that are oppositely arranged, and a fifth side a5 and the sixth side a6 that are oppositely arranged, the third side a3 is arranged close to the first color sub-pixel 21, and the fifth side a5 is arranged close to the second color sub-pixel 22.

As shown in graph 'a' in FIG. 4, the third side a3 is a side in the third color sub-pixel 23 that is adjacent to the first color sub-pixel 21, and the fifth side a5 is a side in the third color sub-pixel 23 that is adjacent to the second color sub-pixel 22.

In some embodiments, the distance d4 between the third side a3 and the fourth side a4 may be greater than the distance d5 between the fifth side a5 and the sixth side a6.

Since the second side length s2 is greater than the first side length s1, by setting the distance d4 between the third side a3 and the fourth side a4 as being greater than the distance d5 between the fifth side a5 and the sixth side a6, the space of the pixel structure can be fully utilized, and the aperture ratio of the third color sub-pixels 23 is increased.

In a specific implementation, as shown in graph 'a' in FIG. 4, the distance d4 between the third side a3 and the fourth side a4 can be greater than the second side length s2, and the distance d5 between the fifth side a5 and the sixth side a6 can be equal to the second side length s2.

In FIG. 4, the relationship among the first side length s1, the second side length s2, the distance d4 between the third side a3 and the fourth side a4, and the distance d5 between the fifth side a5 and the sixth side a6 is: s1<s2=d5<d4.

In another implementation manner, two third color sub-pixels 23 can correspond to the same vapor deposition opening in the mask plate. That is, the light emitting layers in the two third color sub-pixels 23 can be formed by the same vapor deposition opening in the mask plate.

In this implementation manner, since two third color sub-pixels 23 share one mask opening, the light emitting layers of the two third color sub-pixels 23 are continuous at the boundaries of the two third color sub-pixels 23.

Since the two third color sub-pixels 23 share one vapor deposition opening, no solid material area needs to be provided between the vapor deposition openings, avoiding waste of space caused by the solid material area. In addition, a pixel defining layer can be provided between two third color sub-pixels 23 sharing one vapor deposition opening. The manufacturing precision of the pixel defining layer is high, and the minimum width of the pixel defining layer can reach 10 microns. Therefore, the distance between two third color sub-pixels 23 (that is, the distance between adjacent first side a1 and second side a2) can be reduced, so that the aperture ratio of third color sub-pixels 23 can be increased, improving the luminescence lifetime of third color sub-pixels 23, and prolonging the service lifetime of the display device.

In some embodiments, the shape of the first color sub-pixel 21 can be a triangle. Specifically, an inner angle of the triangle close to the first inner corner c1 can be the same as the first inner corner c1. For example, when the imaginary quadrilateral S is a square or a rectangle, the first inner corner c1 is 90°. Accordingly, the triangle can be a right triangle, and the right angle is close to the first inner corner c1, as shown in graph 'a' of FIG. 5.

In some embodiments, the shape of the second color sub-pixel 22 is a triangle. Specifically, an inner angle of the triangle close to the second inner corner c2 can be the same as the second inner corner c2. For example, when the imaginary quadrilateral S is a square or a rectangle, the second inner corner c2 is 90°. Accordingly, the triangle can be a right triangle, and the right angle is close to the second inner corner c2, as shown in graph 'a' of FIG. 5.

In some embodiments, the shape of the first color sub-pixel 21 and the shape of the second color sub-pixel 22 can both be an isosceles right triangle.

Figure 5:
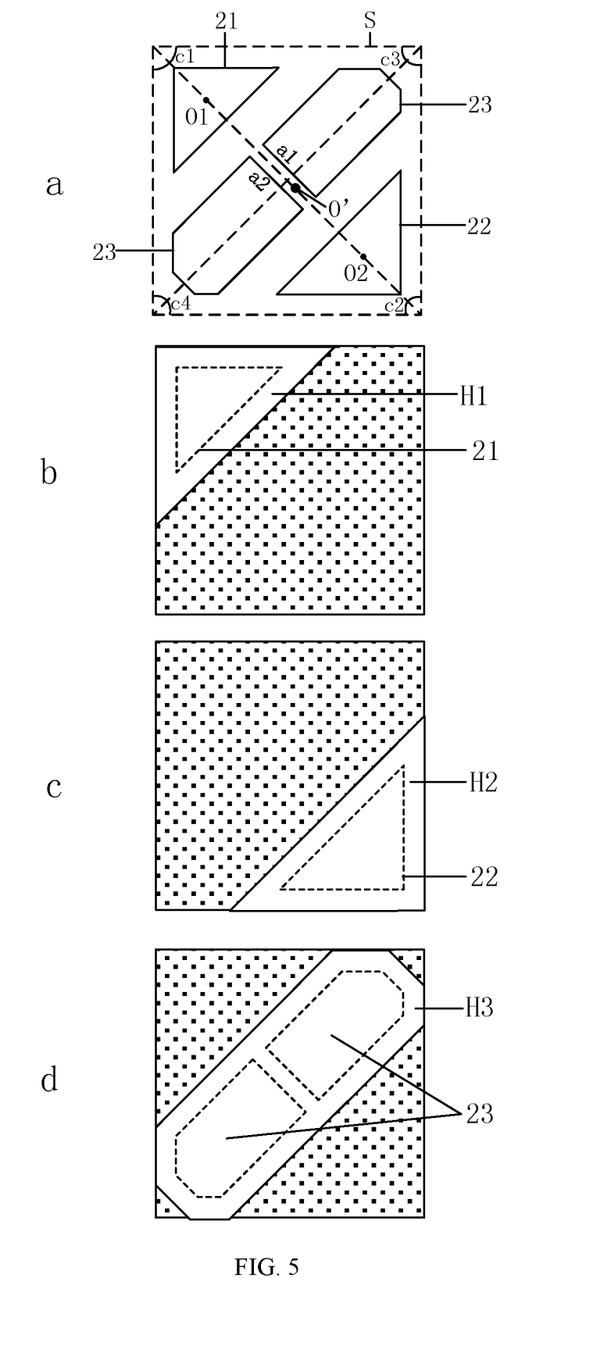
FIG. 5 is a schematic diagram illustrating a fourth pixel structure and a mask plate provided by the present disclosure.

As shown in graph 'a' in FIG. 5, the imaginary quadrilateral S is a square, and the shapes of the first color sub-pixel 21 and the second color sub-pixel 22 are both isosceles right triangles.

When the first color sub-pixel 21 is a red sub-pixel R and the second color sub-pixel 22 is a green sub-pixel G, the length of the right-angle side of the second color sub-pixel 22 can be larger than that of the right-angle side of the first color sub-pixel 21, thereby improving the luminescence lifetime of the second color sub-pixel. Certainly, the length of the right-angle side of the second color sub-pixel 22 can also be equal to that of the right-angle side of the first color sub-pixel 21, which is not limited in the present disclosure.

As shown in FIG. 5, graph 'b' shows a high-precision metal mask plate with a vapor deposition opening H1, and the vapor deposition opening H1 corresponds to the first color sub-pixel 21 (indicated by the dotted line box in graph 'b').

As shown in FIG. 5, graph 'c' shows a high-precision metal mask plate with a vapor deposition opening H2, and the vapor deposition opening H2 corresponds to the second color sub-pixel 22 (indicated by the dotted line box in graph 'c').

As shown in FIG. 5, graph 'd' shows a high-precision metal mask plate with a vapor deposition opening H3, and the vapor deposition opening H3 corresponds to two third color sub-pixels 23 (indicated by the dotted line box in graph 'd').

In the manufacturing process of the mask plate, it is hard to accurately etch an acute angle in the vapor deposition opening. To solve this problem, In some embodiments, at least one inner corner in the triangle is chamfered.

In a specific implementation, all acute angles in the triangle can be chamfered, thereby reducing the manufacturing difficulty of the mask plate and improving the etching precision of the vapor deposition opening.

Figure 6:
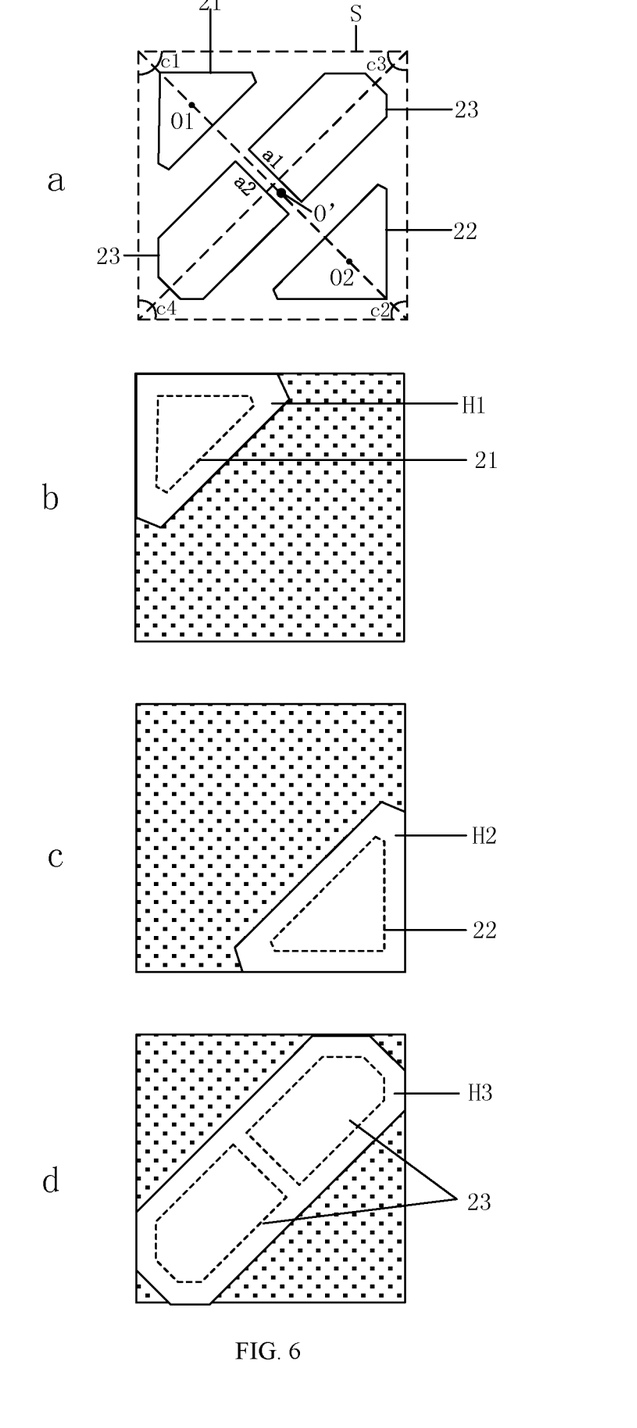
FIG. 6 is a schematic diagram illustrating a fifth pixel structure and a mask plate provided by the present disclosure.

As shown in graph 'a' in FIG. 6, two acute angles in the isosceles right triangle are chamfered.

As shown in FIG. 6, graph 'b' shows a high-precision metal mask plate with a vapor deposition opening H1, and the vapor deposition opening H1 corresponds to the first color sub-pixel 21 (indicated by the dotted line box in graph 'b'); graph 'c' shows a high-precision metal mask plate with a vapor deposition opening H2, and the vapor deposition opening H2 corresponds to the second color sub-pixel 22 (indicated by the dotted line box in graph 'c'); graph 'd' shows a high-precision metal mask plate with a vapor deposition opening H3, and the vapor deposition opening H3 corresponds to two third color sub-pixels 23 (indicated by the dotted line box in graph 'd').

As can be seen from FIG. 6, the acute angles of the vapor deposition openings H1, H2 corresponding to the isosceles right triangles are also chamfered.

It should be noted that the vapor deposition opening corresponding to respective sub-pixel needs to cover the sub-pixel. The shape of the vapor deposition opening corresponding to respective sub-pixel may be the same as the shape of the sub-pixel, as shown in FIGS. 2 to 6. For example, when the shape of the sub-pixel is a square, the shape of the vapor deposition opening corresponding to the sub-pixel can also be a square; when the shape of the sub-pixel is a regular octagon, the shape of the vapor deposition opening corresponding to the sub-pixel can also be a regular octagon; when the shape of the sub-pixel is a triangle, the shape of the vapor deposition opening corresponding to the sub-pixel can also be a triangle, and so on.

In a specific implementation, the ratio between the area of the first color sub-pixel 21, the area of the second color sub-pixel 22, and the total area of the two third color sub-pixels 23 can be adjusted according to actual needs and the material of the light emitting layer. For example, in graph 'a' shown in FIG. 2, the ratio is 1:1:1.5; in graph 'a' shown in FIG. 3 and FIG. 4, the ratio is 1:1.2:2.4; in graph 'a' shown in FIG. 5 and FIG. 6, the ratio between the area of the first color sub-pixel 21 and the area of the second color sub-pixel 22 is 1:1.2, and the ratio of the total area of the two third color sub-pixels 23 can be greater than 2.4.

The ratio between the area of the first color sub-pixel 21, the area of the second color sub-pixel 22 and the total area of the two third color sub-pixels 23 is the ratio between the aperture ratio of the first color sub-pixel 21, the aperture ratio of the second color sub-pixel 22 and the total aperture ratio of the two third color sub-pixels 23.

Figure 8:
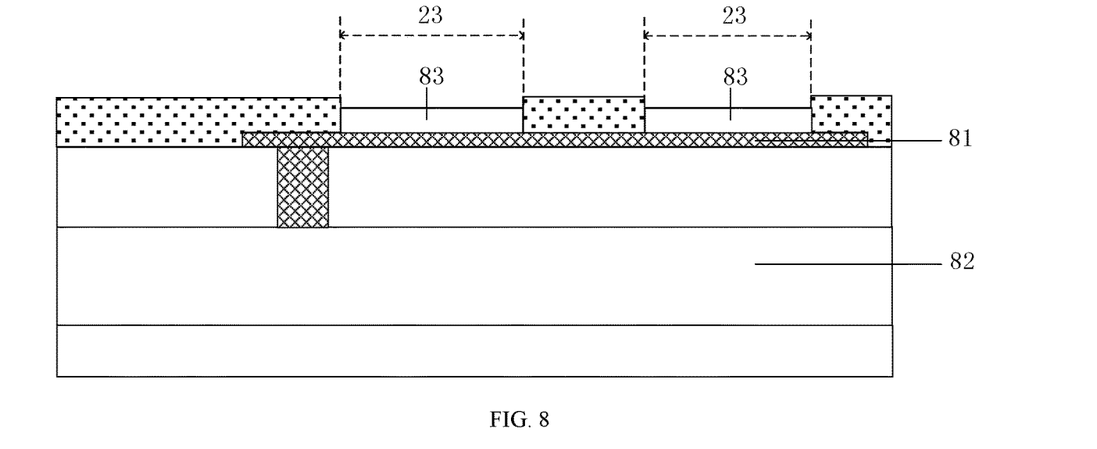
FIG. 8 is a schematic cross-sectional diagram of a pixel structure provided by the present disclosure.

As shown in FIG. 8, driving electrodes 81 of the two third color sub-pixels 23 can be connected to the same driving circuit 82, and the driving circuit 82 is configured to apply a drive signal to the driving electrodes 81 to drive the light emitting layer 83 in the third color sub-pixel 23 to emit light.

Since the driving circuit 82 is connected to the driving electrodes 81 of the two third color sub-pixels 23, the light emitting layers 83 of the two third color sub-pixels 23 can be driven to emit light simultaneously.

In a specific implementation, the light emitting layers 83 of the two third color sub-pixels 23 can be connected to the same driving electrode 81 through wires, and then connected to the driving circuit 82 through the driving electrode 81, as shown in FIG. 8. Alternatively, the light emitting layers 83 of the two third color sub-pixels 23 may be connected to different driving electrodes 81 respectively, and the two driving electrodes 81 are connected to the same driving circuit 82.

In the case that the two third color sub-pixels 23 share one driving circuit 82, the backplane circuit and the driving circuit 82 can still use the driving mode of the pixel structure shown in FIG. 1, so that the pixel structure provided by the present disclosure will not pose additional design burden on the backplane circuit and driving circuit 82.

Of course, in a specific implementation, the driving electrodes 81 of the two third color sub-pixels 23 may also be connected to different driving circuits 82 to realize independent driving, which is not limited in the present disclosure.

In the pixel structure shown in graph 'a' in FIG. 2 to FIG. 6, each of the first color sub-pixel 21 and the third color sub-pixel 23 arranged along a first direction has a side close to a first imaginary side, and such two sides of the first color sub-pixel 21 and the third color sub-pixel 23 can lie on the same line. The first imaginary side is a side of the imaginary quadrilateral S that extends in the first direction and is close to the first color sub-pixel 21. The first direction may be the horizontal direction or the vertical direction in FIG. 2 to FIG. 6.

For example, in FIG. 2 and FIG. 6, the first color sub-pixel 21 and the third color sub-pixel 23 located at the third inner corner are horizontally arranged, then the first imaginary side is the upper side of the imaginary quadrilateral. The upper side of the first color sub-pixel 21 is close to the first imaginary side, and the upper side of the third color sub-pixel 23 located at the third inner corner is close to the first imaginary side. Therefore, the upper side of the first color sub-pixel 21 and the upper side of the third color sub-pixel 23 located at the third inner corner may lie on the same line.

Similarly, in the pixel structure shown in graph 'a' in FIG. 2 to FIG. 6, each of the second color sub-pixel 22 and the third color sub-pixel 23 arranged along a second direction has a sides close to a second imaginary side, such two sides of the second color sub-pixel 22 and the third color sub-pixel 23 can also lie on the same line. The second imaginary side is a side of the imaginary quadrilateral S that extends in the second direction and is close to the second color sub-pixel 22. The second direction may be the horizontal direction or vertical direction in FIG. 2 to FIG. 6.

For example, in FIG. 2 and FIG. 6, the second color sub-pixel 22 and the third color sub-pixel 23 located at the third inner corner are vertically arranged, then the second imaginary side is the right side of the imaginary quadrilateral. The right side of the second color sub-pixel 22 is close to the second imaginary side, and the right side of the third color sub-pixel 23 located at the third inner corner is close to the second imaginary side. Therefore, the right side of the second color sub-pixel 22 and the right side of the third color sub-pixel 23 located at the third inner corner may lie on the same line.

It should be noted that the shape of each sub-pixel such as the first color sub-pixel 21, the second color sub-pixel 22 or the third color sub-pixel 23 refers to the shape of the light emitting area of the sub-pixel. The side of each sub-pixel refers to the side of the light emitting area of the sub-pixel. The side length of each sub-pixel refers to the side length of the light emitting area of the sub-pixel. The area of each sub-pixel refers to the area of the light emitting region of the sub-pixel. The distance between two sub-pixels refers to the minimum distance between the opening areas of two sub-pixels.

In the actual process, due to the limitation of process conditions or other factors, there may be some deviations in the shape, location and relative positional relationship of various sub-pixels. The shape, location and relative positional relationship of various sub-pixels should roughly meet the above conditions.

The present disclosure further provides a display substrate, including the pixel structure provided by any solution described above.

Those skilled in the art can understand that the display device has the advantages of the previous pixel structure.

In the display substrate provided by the present disclosure, each pixel structure has a real resolution, and there is no common sub-pixel between adjacent pixel structures, thus the display effect is better.

Figure 9:
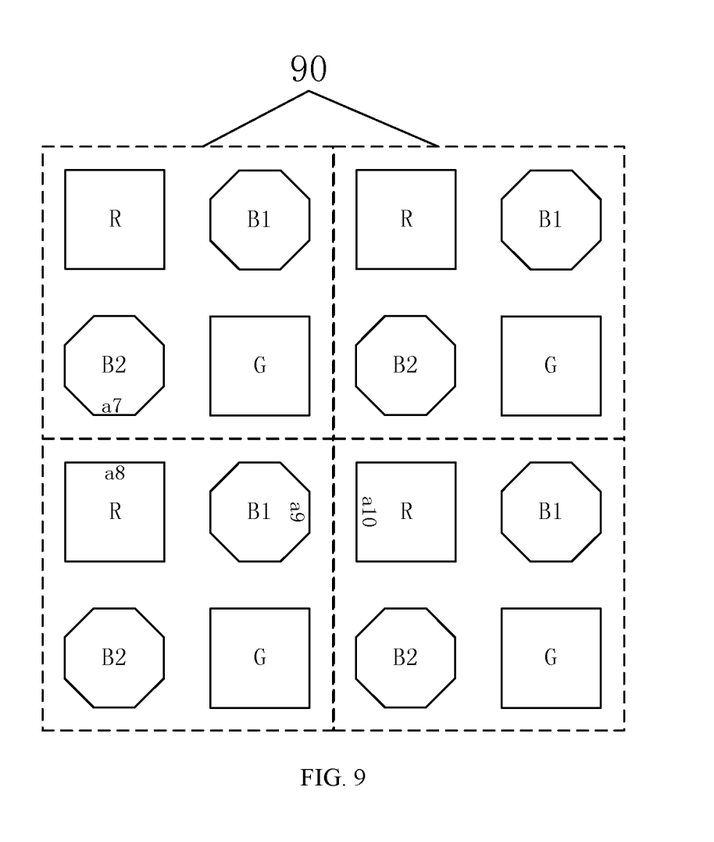
FIG. 9 is a schematic plan view of a display substrate provided by the present disclosure.

In some embodiments, as shown in FIG. 9, the display substrate may include a plurality of pixel structures 90 arranged in an array.

As shown in FIG. 9, a plurality of pixel structures 90 are arranged in an array along the row direction and the column direction respectively.

In the pixel structure arranged in an array, any two adjacent sub-pixels have adjacent sides, and the adjacent sides may be parallel to each other. As shown in FIG. 9, the side a7 and the side a8 are adjacent to and parallel to each other, and the side a9 and the side a10 are adjacent to and parallel to each other.

The present disclosure further provides a display device, including any display substrate described above.

Those skilled in the art can understand that the display device has the advantages of the display substrate described above.

It should be noted that the display device in the embodiment can be any product or component with 2D or 3D display function, such as a display panel, electronic paper, a mobile phone, a tablet computer, a TV set, a notebook computer, a digital photo frame, and a navigator.

Various embodiments in the specification are described in a progressive manner, each embodiment focuses on the difference from other embodiments, and the same and similar parts of various embodiments can be referred to each other.

Finally, it should be noted that, in the present disclosure, relationship terms such as first and second are only used to distinguish one entity or operation from another entity or operation, and do not necessarily require or imply any such actual relationship or sequence exists between these entities or operations. The terms "comprising", "including" or any other variation thereof are intended to encompass non-exclusive inclusion such that a process, method, article or device including a list of elements includes not only those elements, but also other not expressly listed elements, or also include elements inherent to such a process, method, article or apparatus. Without further limitation, an element qualified by the phrase "comprising a . . . " does not preclude the presence of additional identical elements in a process, method, article or apparatus that includes the element.

A pixel structure, a display substrate, and a display device provided by the present disclosure have been described above in detail. Herein, specific examples are used to illustrate the principle and implementation of the present disclosure. The description of the above embodiments is only used to help understand the method of the present disclosure and its core idea. Meanwhile, for those skilled in the art, according to the idea of this disclosure, there will be changes in the specific implementation and application range. In summary, the content of this specification should not be understood as a limitation of the present disclosure.

Other embodiments of the present disclosure will be apparent to those skilled in the art from consideration of the specification and practice of the present disclosure disclosed herein. The present application is intended to cover any variations, uses, or adaptations of the present disclosure, which are consistent with the general principles of the present disclosure and include common general knowledge or conventional technical means in the art that are not disclosed in the present disclosure. The specification and embodiments are illustrative, and the real scope and spirit of the present disclosure is defined by the appended claims.

It should be understood that the present disclosure is not limited to the precise structures that have been described above and shown in the drawings, and various modifications and changes can be made without departing from the scope thereof. The scope of the present disclosure is merely defined by the appended claims.

Terms such as "one embodiment", "an embodiment", or "one or more embodiments" used herein means that a particular feature, structure, or characteristic described in connection with the embodiment is included in at least one embodiment of the present disclosure. Additionally, please note that examples of the phrase "in one embodiment" herein do not necessarily all refer to the same embodiment.

In the description provided herein, numerous specific details are set forth. However, it is understood that embodiments of the present disclosure may be practiced without these specific details. In some instances, well-known methods, structures and techniques have not been shown in detail in order to not obscure the understanding of this description.

In the claims, any reference signs placed between parentheses shall not be construed as limiting the claim. The phrase "comprising/including" does not exclude the presence of elements or steps not listed in a claim. The phrase "a" or "an" preceding an element does not exclude the presence of a plurality of such elements. The disclosure can be implemented by means of hardware comprising several distinct elements, and by means of a suitably programmed computer. In a unit claim enumerating several means, several of these means can be embodied by one and the same item of hardware. The use of the words "first", "second", and "third", etc. does not indicate any order. These words can be interpreted as names.

Finally, it should be noted that the above embodiments are only used to illustrate the technical solutions of the present disclosure, but not to limit them; although the present disclosure has been described in detail with reference to the foregoing embodiments, those ordinary skilled in the art should understand that, the technical solutions described in the foregoing embodiments can still be modified, or some or all of the technical features thereof can be equivalently replaced; and these modifications or replacements do not make the essence of the corresponding technical solutions deviate from the sprits and scope of the technical solutions of the embodiments of the present disclosure.

The invention claimed is:

1. A pixel structure, comprising a plurality of sub-pixels located in an imaginary quadrilateral, wherein the plurality of sub-pixels comprises a first color sub-pixel, a second color sub-pixel and at least one third color sub-pixel, the imaginary quadrilateral comprises a first inner corner and a second inner corner that are opposite to each other, and a third inner corner and a fourth inner corner that are opposite to each other;

wherein the first color sub-pixel is located at the first inner corner, the second color sub-pixel is located at the second inner corner, and the at least one third color sub-pixel is located at the third inner corner and the fourth inner corner, wherein the pixel structure comprises two third color sub-pixels that are located at the third inner corner and the fourth inner corner respectively, light emitting layers of the two third color sub-pixels are disconnected at boundaries of the two third color sub-pixels; the third color sub-pixel located at the third inner corner has a first side, the third color sub-pixel located at the fourth inner corner has a second side, and the first side and the second side are adjacent and parallel to each other, wherein a shape of the first color sub-pixel is a quadrilateral, a shape of the second color sub-pixel is a quadrilateral, and a shape of the third color sub-pixel is an octagon, wherein the quadrilateral is a square, a side of the first color sub-pixel has a first side length, and a side of the second color sub-pixel has a second side length, and the second side length is greater than or equal to the first side length.

2. The pixel structure according to claim 1, wherein the octagon is a regular octagon.

3. The pixel structure according to claim 2, wherein a distance between any two opposite sides of the regular octagon is equal to the second side length.

4. The pixel structure according to claim 1, wherein the second side length is greater than the first side length; the octagon has a third side and a fourth side that are opposite to each other, and a fifth side and a sixth side that are opposite to each other, the third side is arranged close to the first color sub-pixel, and the fifth side is arranged close to the second color sub-pixel;

wherein a distance between the third side and the fourth side is greater than a distance between the fifth side and the sixth side.

5. The pixel structure according to claim 4, wherein the distance between the third side and the fourth side is greater than the second side length, and the distance between the fifth side and the sixth side is equal to the second side length.

6. A pixel structure, comprising a plurality of sub-pixels located in an imaginary quadrilateral, wherein the plurality of sub-pixels comprises a first color sub-pixel, a second color sub-pixel and at least one third color sub-pixel, the imaginary quadrilateral comprises a first inner corner and a second inner corner that are opposite to each other, and a third inner corner and a fourth inner corner that are opposite to each other;

wherein the first color sub-pixel is located at the first inner corner, the second color sub-pixel is located at the second inner corner, and the at least one third color sub-pixel is located at the third inner corner and the fourth inner corner, wherein the pixel structure comprises two third color sub-pixels that are located at the third inner corner and the fourth inner corner respectively, and wherein light emitting layers of the two third color sub-pixels are continuous at boundaries of the two third color sub-pixels.

7. The pixel structure according to claim 6, wherein at least one of the first color sub-pixel and the second color sub-pixel has a shape of a triangle.

8. The pixel structure according to claim 7, wherein at least one inner angle of the triangle is chamfered.

9. The pixel structure according to claim 7, wherein the triangle is an isosceles right-angled triangle, and a length of a right-angled side of the second color sub-pixel is greater than or equal to a length of a right-angled side of the first color sub-pixel.

10. The pixel structure according to claim 1, wherein a ratio between an area of the first color sub-pixel, an area of the second color sub-pixel and a total area of two third color sub-pixel is one of 1:1:1.5 and 1:1.2:2.4.

11. The pixel structure according to claim 1, wherein driving electrodes of the two third color sub-pixels are connected to one driving circuit, and the driving circuit is configured to apply a driving signal to the driving electrodes, so that the third color sub-pixels are driven to emit light.

12. The pixel structure according to claim 1, wherein the first color sub-pixel is a red sub-pixel, the second color sub-pixel is a green sub-pixel, and the third color sub-pixel is a blue sub-pixel.

13. The pixel structure according to claim 1, wherein the imaginary quadrilateral is a square.

14. A display substrate comprising a plurality of pixel structures arranged in an array, wherein each of the pixel structures comprises a plurality of sub-pixels located in an imaginary quadrilateral, wherein the plurality of sub-pixels comprises a first color sub-pixel, a second color sub-pixel and at least one third color sub-pixel, the imaginary quadrilateral comprises a first inner corner and a second inner corner that are opposite to each other, and a third inner corner and a fourth inner corner that are opposite to each other;

wherein the first color sub-pixel is located at the first inner corner, the second color sub-pixel is located at the second inner corner, and the at least one third color sub-pixel is located at the third inner corner and the fourth inner corner, wherein the pixel structure comprises two third color sub-pixels that are located at the third inner corner and the fourth inner corner respectively, light emitting layers of the two third color sub-pixels are disconnected at boundaries of the two third color sub-pixels; the third color sub-pixel located at the third inner corner has a first side, the third color sub-pixel located at the fourth inner corner has a second side, and the first side and the second side are adjacent and parallel to each other, wherein a shape of the first color sub-pixel is a quadrilateral, a shape of the second color sub-pixel is a quadrilateral, and a shape of the third color sub-pixel is an octagon, and wherein the quadrilateral is a square, a side of the first color sub-pixel has a first side length, and a side of the second color sub-pixel has a second side length, and the second side length is greater than or equal to the first side length.

15. A display device, comprising the display substrate according to claim 14.

16. The pixel structure according to claim 6, wherein a ratio between an area of the first color sub-pixel, an area of the second color sub-pixel and a total area of two third color sub-pixel is one of 1:1:1.5 and 1:1.2:2.4.

17. The pixel structure according to claim 6, wherein driving electrodes of the two third color sub-pixels are connected to one driving circuit, and the driving circuit is configured to apply a driving signal to the driving electrodes, so that the third color sub-pixels are driven to emit light.

18. The pixel structure according to claim 6, wherein the first color sub-pixel is a red sub-pixel, the second color sub-pixel is a green sub-pixel, and the third color sub-pixel is a blue sub-pixel.

19. The pixel structure according to claim 6, wherein the imaginary quadrilateral is a square.

20. A display substrate, comprising the pixel structure according to claim 6.

* * * * *